United States Patent
Schellekens et al.

(10) Patent No.: US 10,228,410 B2
(45) Date of Patent: Mar. 12, 2019

(54) DEVICE FOR MONITORING PARTIAL DISCHARGES IN AN ELECTRICAL NETWORK

(71) Applicant: Schneider Electric Industries SAS, Rueil-Malmaison (FR)

(72) Inventors: Hans Schellekens, La Terrasse (FR); Christophe Preve, La Tronche (FR)

(73) Assignee: SCHNEIDER ELECTRIC INDUSTRIES SAS, Rueil Malmaison (FR)

( * ) Notice: Subject to any disclaimer, the term of this patent is extended or adjusted under 35 U.S.C. 154(b) by 109 days.

(21) Appl. No.: 15/147,249

(22) Filed: May 5, 2016

(65) Prior Publication Data

US 2016/0349309 A1    Dec. 1, 2016

(30) Foreign Application Priority Data

May 28, 2015    (FR) ...................... 15 54807

(51) Int. Cl.
*G01R 15/16*    (2006.01)
*G01R 31/12*    (2006.01)
(Continued)

(52) U.S. Cl.
CPC ..... *G01R 31/1254* (2013.01); *G01R 31/3274* (2013.01); *G01R 31/3275* (2013.01); *H01H 33/668* (2013.01); *H01H 9/54* (2013.01)

(58) Field of Classification Search
CPC ...... G01R 15/16; G01R 31/12; G01R 31/025; G01R 31/32; G08B 21/00; H01H 33/26; H01H 33/668; H01H 33/66
See application file for complete search history.

(56) References Cited

U.S. PATENT DOCUMENTS

| 4,103,291 A * | 7/1978 | Howe | ................ G01R 31/3274 340/522 |
| 7,253,630 B1 * | 8/2007 | Zhou | .................. G01R 31/3274 324/424 |
| 2006/0181267 A1 * | 8/2006 | Marchand | .......... G01R 31/3271 324/750.14 |

FOREIGN PATENT DOCUMENTS

CN    103 413 721 A    11/2013
CN    203 491 185 U    3/2014
(Continued)

OTHER PUBLICATIONS

French Preliminary Search Report with written opinion dated Mar. 22, 2016 in French application 15 54807, filed on May 28, 2015 ( with English Translation of Categories of Cited Documents).

*Primary Examiner* — Neel Shah
(74) *Attorney, Agent, or Firm* — Oblon, McClelland, Maier & Neustadt, L.L.P.

(57) ABSTRACT

A device for monitoring partial discharges in an AC electrical network, the monitoring device being mounted in a switching apparatus provided with a vacuum bottle connected to one phase of the AC network. The monitoring device includes a partial discharge detector positioned facing the vacuum bottle and an electronic processing unit receiving a first signal representative of the partial discharges detected by the capacitive sensor and receiving a second signal representative of the voltage of the electrical network. The processing unit includes discriminating means which are capable, according to the first signal and the second signal, of determining whether the partial discharges originate from a loss of vacuum in the vacuum bottle or originate from another cause external to the vacuum bottle.

16 Claims, 3 Drawing Sheets

(51) Int. Cl.
*H01H 33/26* (2006.01)
*H01H 33/66* (2006.01)
*G08B 21/00* (2006.01)
*H01H 33/668* (2006.01)
*G01R 31/327* (2006.01)
*H01H 9/54* (2006.01)

(56) References Cited

FOREIGN PATENT DOCUMENTS

| | | | | |
|---|---|---|---|---|
| JP | 1092277 | * | 4/1998 | ............ H01H 33/66 |
| JP | 2014-216208 | | 11/2014 | |

* cited by examiner

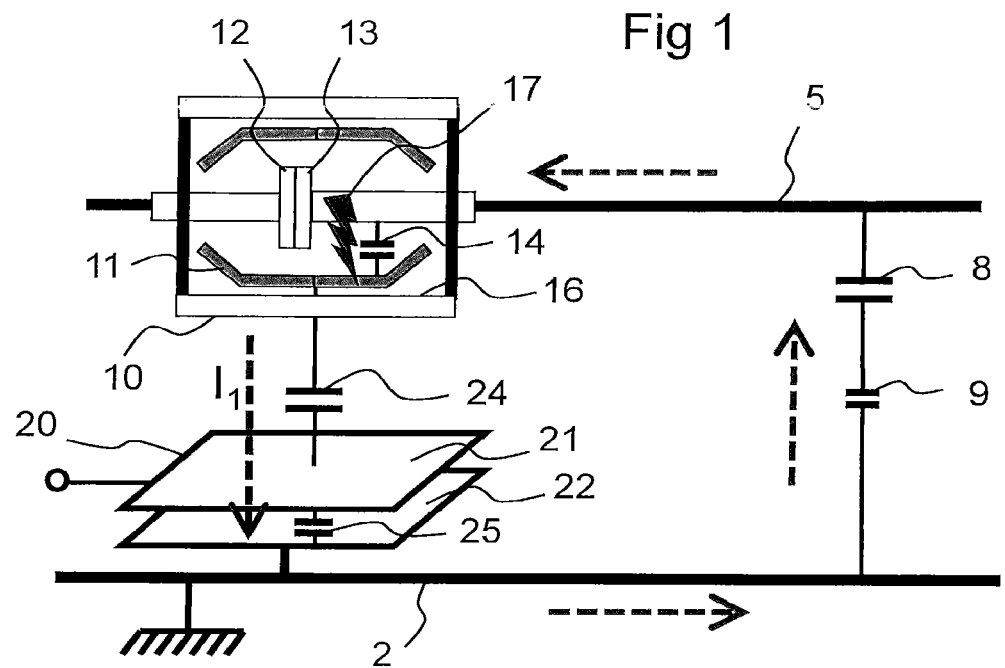
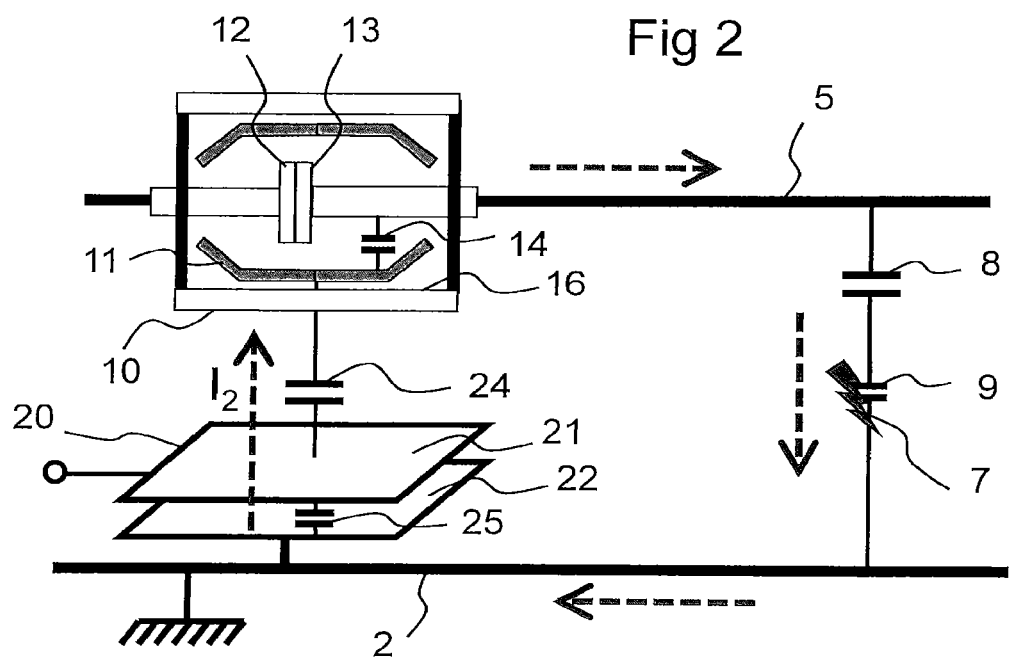

DEVICE FOR MONITORING PARTIAL DISCHARGES IN AN ELECTRICAL NETWORK

TECHNICAL FIELD OF THE INVENTION

The invention concerns a device for monitoring partial discharges, occurring in a medium voltage or high voltage AC electrical network notably a three-phase network.

The invention applies more particularly to switching apparatuses, such as vacuum switches or circuit breakers, of the type insulated by a gas or by solid insulators or by a combination of gas with an insulating wall, and is notably designed to distinguish between partial discharges originating from a loss of vacuum in the vacuum switch or circuit breaker and partial discharges originating from any other cause.

PRIOR ART

It is known, e.g. see documents U.S. Pat. No. 4,103,291 and EP2463883, to monitor the quality of the vacuum in vacuum bottles of a circuit breaker connected to a medium voltage or high voltage electrical network, for ensuring the correct operation of the circuit breaker. To do this, the monitoring systems often use a capacitive sensor that is placed facing a vacuum bottle and which is associated with suitable electronics, the sensor being capable of detecting a partial discharge at the bottle. Operation is based on the dielectric characteristics of the vacuum. In the event of a loss of vacuum in the bottle, sparkovers occur inside the bottle so that the current flowing in a capacitive sensor placed facing the bottle generates pulses which are detectable by the sensor. Thus, the current flowing through this capacitive sensor is capable of providing information representative of the vacuum state of the bottle.

However, these monitoring systems do not discriminate between different types of partial discharge which may be detected by such a capacitive sensor. As noted above, the first type of partial discharge is a loss of vacuum in the vacuum bottle of the circuit breaker on which the sensor is installed. But other types of partial discharge are also detectable by such a capacitive sensor and may originate from components of the electrical network that are external to the circuit breaker, such as the cables of the electrical network or other apparatuses connected to the electrical network. It may be noted that these other types of partial discharge include discharges due to a corona effect in the air, or discharges between conductive parts at floating potential (also called floating parts in air) e.g. at the cables, etc.

Thus, current monitoring systems may detect partial discharges which could be wrongly imputed to a vacuum loss in vacuum circuit breakers, whereas they originate from an external source. This does not optimize the efficiency and maintenance of these switching apparatuses.

In document JP2014216208A, an algorithm operates on the partial discharges detected signals on one side a filtering on a frequency double of the network frequency, and on another side a filtering on a frequency band of 10 kHz to 100 kHz, then determines a loss of vacuum when both sides provide a signal exceeding a threshold, without taking into account the polarity of the signals nor the phase angle with respect to the network voltage.

One object of the invention is therefore to overcome the drawbacks mentioned above and to best differentiate the different types of partial discharge detected in the simplest way possible. Thanks to the invention, the operation and maintenance of an electrical apparatus will be optimized since it will be possible to tell the difference between real losses of vacuum occurring in the vacuum circuit breaker and the other sources of partial discharges.

DISCLOSURE OF THE INVENTION

This object is achieved by a device for monitoring partial discharges in an AC electrical network, the monitoring device being mounted in a switching apparatus provided with a vacuum bottle connected to one phase of the AC network. The monitoring device includes a partial discharge detector positioned facing the vacuum bottle, and an electronic processing unit receiving a first signal representative of the partial discharges detected by the detector, and receiving a second signal representative of a voltage in the vacuum bottle. According to the invention, the electronic processing unit comprises counting means for counting during a predetermined duration the pulses generated by the partial discharges on the first signal, and comprises discriminating means which are capable of calculating a phase angle of said pulses of the first signal with respect to the second signal, and which are capable, according to a value of said phase angle, of determining whether the partial discharges originate from a loss of vacuum in the vacuum bottle.

Thanks to this phase angle, the discriminating means determine that the partial discharges originate from a loss of vacuum in the vacuum bottle when the phase angle is between −20° and +20°. Outside of these values, the partial discharges originate from a cause other than a loss of vacuum in the vacuum bottle. For example, the partial discharges originate from a corona effect when the phase angle is between 250° and 290°, and the partial discharges originate from an effect between conductive parts at floating potential when the phase angle is between 170° and 210°.

According to a preferred embodiment, the detector is a capacitive sensor that comprises a first conductive surface separated by an insulating layer from a second conductive surface connected to earth, the first conductive surface being positioned facing the vacuum bottle.

Moreover, the discriminating means may also determine that the partial discharges originate from a loss of vacuum in the vacuum bottle when the number of negative pulses is greater than the number of positive pulses generated by the partial discharges on the first signal.

The invention also relates to a switching apparatus, of the circuit breaker or switch type, comprising a vacuum bottle for each phase of a multiphase AC electrical network and which includes such a monitoring device for each phase.

The invention also relates to a method for monitoring partial discharges in an AC electrical network, the method being implemented in such a monitoring device. The monitoring method allows to determine the origin of partial discharges according to the phase angle.

BRIEF DESCRIPTION OF THE FIGURES

Other features will appear in the detailed description that follows made with reference to the accompanying drawings in which:

FIG. 1 depicts a simplified diagram of a vacuum bottle of a switching apparatus with a capacitive sensor placed facing the bottle, in the case of a loss of vacuum in the bottle, FIG. 2 shows the same simplified diagram of a vacuum bottle in the case of partial discharges occurring outside the bottle.

Referring to FIG. 1, a vacuum bottle 10 of a switching apparatus, such as a switch or a circuit breaker, comprises two contact electrodes 12 and 13 (of which one of the two is movable for opening or closing the contact) connected to one phase 5 of a multiphase AC electrical network. In the embodiment in FIG. 1, a metal screen at floating potential 11 surrounds the electrodes 12, 13 so that a 'vacuum' capacitor 14, is formed between the electrodes 12, 13 and this metal screen 11. The value of capacitor 14 is well defined and obviously depends on the design of the vacuum bottle 10. However, in the absence of such a metal screen 11, it may also be envisaged for the capacitor 14 to be determined between the electrodes 12, 13 and the internal wall 16 of the vacuum bottle 10.

Figure 3:
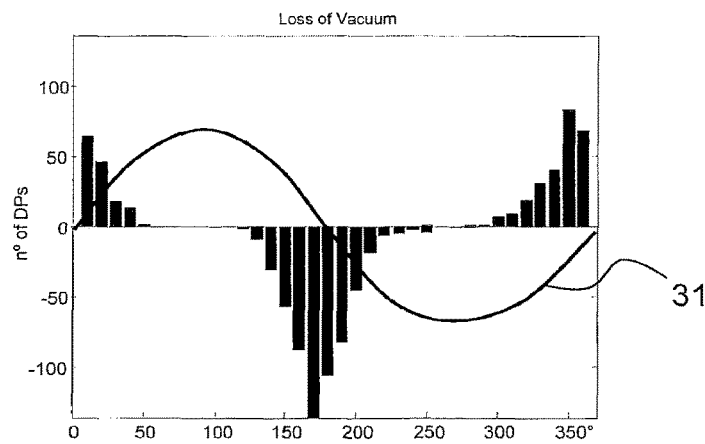
FIGS. 3 to 5 show time diagrams representing in the form of histograms the number of partial discharges over a given period for three types of partial discharge, namely loss of vacuum for FIG. 3, corona effect for FIG. 4 and conductive parts at floating potential for FIG. 5.

The monitoring device according to the invention includes a partial discharge detector which is positioned facing the vacuum bottle, i.e. in a position where it is capable of detecting partial discharges occurring in the vacuum bottle. Such a detector may be a capacitive sensor as described below or any other type of detector capable of detecting partial discharges in the vacuum bottle.

In the preferred embodiment, the detector is a capacitive sensor 20 that comprises a first conductive surface 21 and a second conductive surface 22 separated from each other by an insulating layer. The first conductive surface 21 is positioned facing the metal screen 11 of the vacuum bottle 10 so that a first capacitor 24 is formed between the first conductive surface 21 and the metal screen 11 of the vacuum bottle facing thereto. The second conductive surface 22 is connected to earth 2 so that a second capacitor 25 is formed between the first conductive surface 21 and the second conductive surface 22 connected to earth 2.

FIGS. 1 and 2 also show an equivalent diagram for the various insulating parts existing between the phase 5 and earth 2 and external to the vacuum bottle 10. These insulating parts are depicted diagrammatically in a simplified way in the form of two capacitors 8, 9 connected in series between the phase 5 and earth 2.

When a partial loss of vacuum occurs in the vacuum bottle 10, sparkovers 17 take place inside the bottle between the electrodes 12, 13 and the screen 11, so that the capacitor 14 is intermittently short-circuited. Each sparkover increases the voltage on the capacitor 24 and on the capacitor 25 of the capacitive sensor 20. The increase in the voltage goes hand in hand with a current pulse $I_1$ in the phase 5 to earth 2 direction which passes through the capacitive sensor, as indicated by the arrows in FIG. 1. These current pulses are said to be in phase with the sparkovers.

Conversely, when partial discharges 7 occur outside the vacuum bottle 10 as indicated in FIG. 2, represented diagrammatically, for example, at the capacitor 9, these discharges intermittently increase the voltage on the capacitor 8 and are accompanied by current pulses $I_2$ flowing in the phase 5 to earth 2 direction through the capacitors 8 and 9 as indicated by the arrows in FIG. 2. These current pulses $I_2$ loop back through the capacitive sensor 20 in the earth 2 to phase 5 direction. These current pulses $I_2$ are therefore in the reverse direction to the current pulses $I_1$ and reduce the voltage on the capacitor 25 of the capacitive sensor 20. They are said to be of opposite phase with respect to the current pulses $I_1$. This corresponds to a phase shift of 180° between the current pulses $I_1$ and $I_2$. This phase shift helps to discriminate the origin of the partial discharges.

The monitoring device also includes an electronic processing unit, not represented in the figures, which is connected by a cable to the first conductive surface 21 of the capacitive sensor 20. The processing unit receives a first signal representative of variations in the current flowing through the sensor 20 and is therefore capable of detecting the current pulses $I_1$ or $I_2$ when partial discharges occur. In addition, the processing unit also receives a second signal which is representative of a voltage from the electrical network and of the frequency thereof, e.g. the voltage 31 between the phase and earth in the preferred embodiment. The voltage 31 may be conventionally obtained from a voltage measuring transformer or directly from the capacitive sensor 20. Thanks to this second signal, the processing unit may advantageously synchronize the partial discharges detected with the aid of the first signal and thus determine the phase shift between the partial discharges detected and the phase-earth voltage of the vacuum bottle 10. In an equivalent way, the monitoring device could receive a second signal representative of the voltage between two phases instead of the phase-earth voltage or a signal representative of the voltage between another of the three phases and earth.

The processing unit comprises counting means for counting the partial discharges detected with the aid of the first signal during a predetermined duration sufficiently long for obtaining meaningful measurements and notably for overcoming possible interference. Indeed, the partial discharges give rise to pulses on the first signal which are very brief with respect to the 50 Hz frequency of the electrical network and which occur a large number of times during a network period. It is therefore preferable to count them in order to be able to make better use of them. One duration example is to count the partial discharges during a cycle of 100 periods of 20 msec (for a 50 Hz AC network). This duration of 2 seconds is sufficient for diagnosing a loss of vacuum. Nevertheless, in order to avoid any uncertainty, the loss of vacuum diagnosis is preferably confirmed after a repetition of 5 measurement cycles of 100 periods. The frequency of repetition of each measurement cycle is variable. It may be every 2 seconds at the maximum or typically every minute. Thus, this brings the duration of a loss of vacuum diagnosis from a minimum of 10 seconds to typically 5 minutes. Other durations are obviously conceivable, notably longer durations for accumulating a larger number of measurements.

Figure 4:
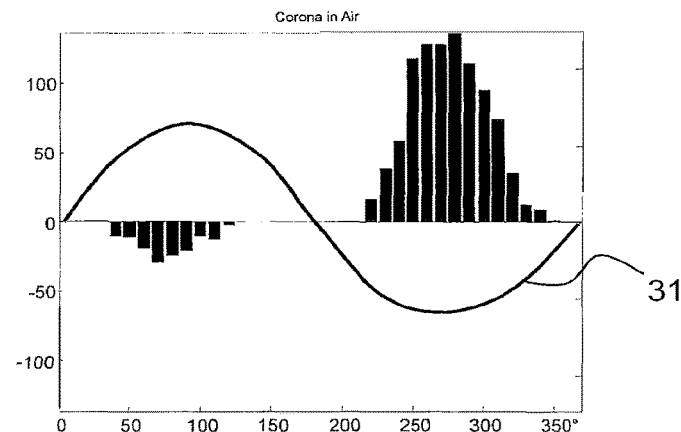
Figure 5:
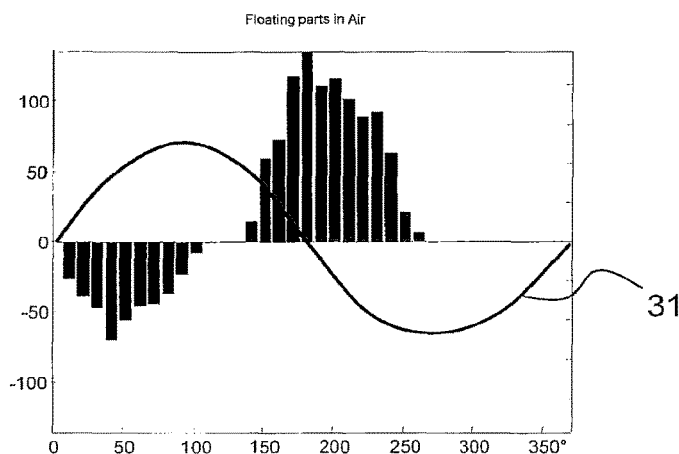

The results of the calculations performed by the processing unit are shown in the graphs of FIGS. 3 to 5. These graphs are histograms which give the number of partial discharges detected during the predetermined duration according to their phase shift with respect to the measured phase-earth voltage 31. These histograms thus determine a signature specific to each type of partial discharge. By analysing these graphs, it is possible to identify the type of partial discharge detected by the monitoring device, in particular to discriminate the partial discharges due to a loss of vacuum in the bottle 10 located facing the capacitive sensor 20 from those due to another cause.

In these graphs, the abscissa corresponds to the phase angle of the measured voltage V (referenced 31) over a full period from 0° to 360°, divided into 10° segments. The ordinate corresponds to the number of partial discharges counted during the predetermined duration of the measurements for each 10° segment of the phase shift with the phase-earth voltage 31 and according to the polarity or the sign of the discharges. The partial discharges are indeed counted separately according to whether they are positive or negative; i.e. according to whether the pulses generated by the partial discharges and detected in the first signal are positive or negative, they are counted as positive or negative.

Thus a single phase angle may be assigned to all the partial discharges detected. Preferably this phase angle is obtained by Fourier transform of the sum of the positive and negative pulses using the first harmonic phase. Alternatively, as it can be seen on all the graphs that the number of positive and negative partial discharges displays a random behaviour, this may be described by a Gaussian curve characterized by a dominant central value of phase angle; this phase angle may be obtained by Fourier transform of each distribution complying with the associated count.

The processing unit comprises discriminating means which calculate the phase angle of the pulses of the first signal with respect to the second sinusoidal signal of the phase-earth voltage 31. The phase shift of these pulses with respect to the phase-earth voltage will be sufficient for discriminating the origin of the partial discharges detected on the first signal and notably determining whether or not the partial discharges originate from a loss of vacuum in the bottle 10. The solution provided by the invention is therefore very simple to use because the value of the phase angle allows to determine the different possible origins of detected partial discharges without requiring more complex calculation, as shown in the next paragraphs.

The graph in FIG. 3 thus shows the case of partial discharges which originate from a loss of vacuum in the bottle located facing the capacitive sensor as depicted in FIG. 1. In this case, the pulses generated by these partial discharges are positive in the vicinity of the transition at 0° of the period, i.e. when the phase angle is predominantly between −20° and +20° with respect to the phase-earth voltage 31, and are negative in the vicinity of the transition at 180° of the period. At the sensor 20, the negative pulses in this case are more numerous than the positive pulses. It means that, in this case, the monitoring method implemented in the monitoring device determines that the partial discharges originate from a loss of vacuum in the vacuum bottle 10 when the phase angle is predominantly between −20° and +20°.

The graph in FIG. 4 shows partial discharges which are external to the vacuum bottle 10 and which originate from a corona effect in air. In this case, the pulses generated by these partial discharges are at the maximum during maximum values of the phase-earth voltage 31. The pulses are positive at the source (represented diagrammatically by the capacitor 9) in the vicinity of the transition at 90° of the period, i.e. between 70° and 110°, but are detected as negative at the capacitive sensor 20. The pulses are negative at the source in the vicinity of an angle of 270° of the period, i.e. when the phase angle is predominantly between 250° and 290° with respect to the phase-earth voltage 31, but are detected as positive at the capacitive sensor 20. It is easily ascertained that the signal consisting of partial positive and negative discharges is opposite in phase with respect to the industrial frequency of the voltage 31. At the sensor 20, the positive pulses in this case are much more numerous than the negative pulses. It means that, in this case, the monitoring method implemented in the monitoring device determines that the partial discharges originate from a Corona effect when the phase angle is predominantly between 250° and 290°.

The graph in FIG. 5 shows partial discharges which are external to the vacuum bottle 10 and occur between conductive parts at floating potential, e.g. at the cables, as depicted in FIG. 2. The pulses are positive at the source (represented diagrammatically by the capacitor 9) in the vicinity of the transition at 50° of the period, i.e. between 30° and 70°, but are detected as negative by the capacitive sensor 20. The pulses are negative at the source in the vicinity of an angle of 190° of the period, i.e. when the phase angle is predominantly between 170° and 210° with respect to the phase-earth voltage 31, but are detected as positive by the capacitive sensor 20. It is easily ascertained that the signal consisting of partial positive and negative discharges is shifted in phase with respect to the industrial frequency of the voltage 31 and in opposition to the partial discharges due to a loss of vacuum in FIG. 3. At the sensor 20, the positive pulses in this case are more numerous than the negative pulses. It means that, in this case, the monitoring method implemented in the monitoring device determines that the partial discharges occur between conductive parts at floating potential when the phase angle is predominantly between 170° and 210°.

Figure 6:
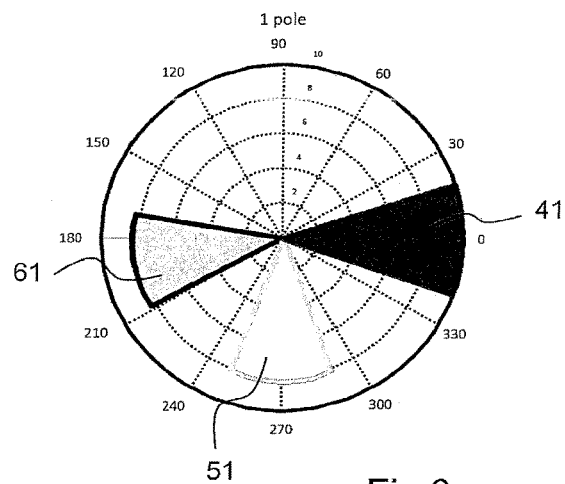
FIG. 6 is a polar coordinate diagram showing three types of partial discharge that may occur in one phase and FIGS. 7 and 8 respectively show this same polar coordinate diagram for two other phases. Finally

FIG. 6 is a polar coordinate diagram that covers the results of FIGS. 3 to 5 and shows the three types of partial discharge that can occur in one of the phases of the electrical network. Each type of partial discharge is represented by a cone of values surrounding a dominant central value of phase angle for the positive pulses generated by these partial discharges. Thus, the cone 41 is representative of partial discharges originating from a loss of vacuum in the bottle, since it is centred around a phase angle equal to 0°. The cone 51 is representative of partial discharges originating from a corona effect in air, since it is centred around a phase angle equal to 270°. The cone 61 is representative of partial discharges originating from a conductive part at floating potential, since it is centred around a phase angle equal to 190°.

In the figures above, it is considered that the pulses should lie predominantly in a cone having 40° of width, i.e. +/−20° around the dominant central value. Nevertheless, according to the quality of the measurements made, this cone may be fully expanded to +/−30° around the dominant central value, since this would remain sufficient for determining the origin of the partial discharges detected by the capacitive sensor 20. For example, if the phase angle of the positive pulses is between −30° and +30° around 0°, the partial discharges will also be considered as originating from a loss of vacuum in the bottle. It means that, in this case, the monitoring method implemented in the monitoring device determines that the partial discharges originate from a loss of vacuum in the vacuum bottle 10 when the phase angle is predominantly between −30° and +30°.

In the preferred embodiment described above, the phase angle may be obtained from a Fourier transform of all the partial discharges, which provides a relevant parameter for calculating the phase angle since this is generally sufficient for determining the origin of the partial discharges, in particular for discriminating whether or not they originate from a loss of vacuum in the bottle located facing the sensor. This thus makes it possible to obtain a very simple method to be implemented in the monitoring device. However, other parameters may also be useful if necessary.

These other parameters may include, for example, the parameter Q which expresses the asymmetry of the partial discharges. The parameter Q may be simplified as the ratio between the number of positive pulses and the number of negative pulses detected during the predetermined duration at the sensor 20 (see document by Edward Gulski, "Computer-Aided Recognition of PD Using Statistical Tools", Delft University Press, Netherlands, 14 Oct. 1991). For example, a loss of vacuum in the vacuum bottle corresponds to a Q ratio less than a predetermined threshold approximately equal to 1, i.e. when the number of negative pulses is greater than the number of positive pulses. Conversely, partial discharges due to a cause external to the vacuum bottle give a Q ratio above this threshold, i.e. when the number of positive pulses is greater than the number of negative pulses. In addition, the partial discharges due to a corona effect have a Q ratio much higher than the partial discharges due to conductive parts at floating potential. It means that, in this case, the monitoring method implemented in the monitoring device determines that the partial discharges originate from a loss of vacuum in the vacuum bottle 10 when the number of negative pulses is greater than the number of positive pulses generated by the partial discharges on the first signal.

The monitoring device may be used in a three-phase AC network for a vacuum circuit breaker thus comprising three vacuum bottles and three capacitive sensors. Preferably, such a vacuum circuit breaker uses a monitoring device having three capacitive sensors but a single shared electronic data processing unit. This processing unit thus receives from the capacitive sensor on each phase a first signal representative of partial discharges and also receives, for each vacuum bottle, a second signal representative of the voltage between the vacuum bottle and earth. In this case, the processing unit of the vacuum circuit breaker generates three diagrams identical to that in FIG. 6, i.e. a diagram for each vacuum bottle.

Figure 7:
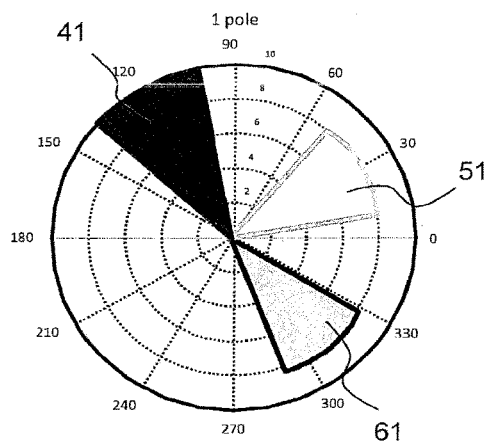
Figure 8:
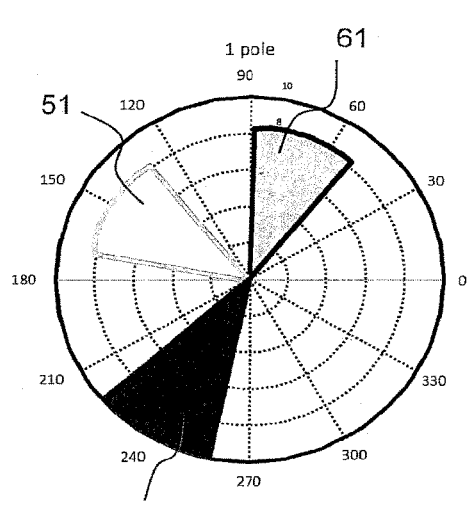

It could also be considered in a simplified way that the processing unit receives only a single second signal representative of the voltage between one of the vacuum bottles and earth, which simplifies the design of the monitoring device. In this case, the processing unit of the vacuum circuit breaker generates a first diagram identical to FIG. 6 for a first vacuum bottle, a second similar diagram but shifted by 120° for a second vacuum bottle as indicated in FIG. 7 and a third similar diagram but shifted by 240° for a third vacuum bottle as indicated in FIG. 8.

Figure 9:
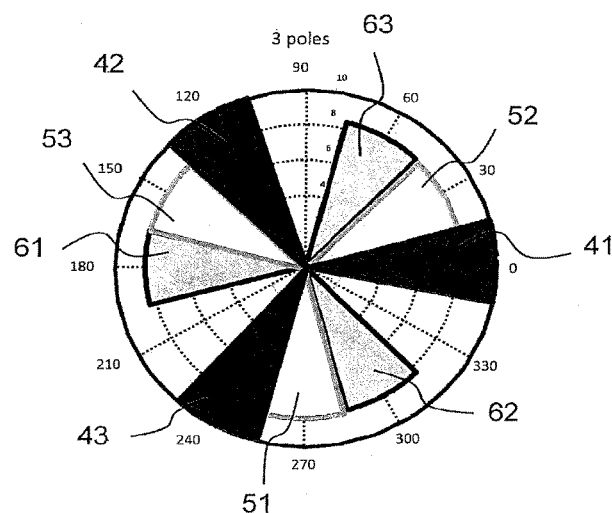
FIG. 9 shows the case with a single sensor for all three phases.

Finally, FIG. 9 shows a polar coordinate diagram which covers the same results in FIG. 6 but presents them for the three phases of a three-phase circuit breaker. This example corresponds to the case where the monitoring device includes a single sensor for the three vacuum bottles of a circuit breaker and a single second signal representative of the voltage between one of the vacuum bottles and earth. The cones 41, 51, 61 correspond to a first phase of the electrical network, the cones 42, 52, 62 correspond to a second phase of the electrical network and the cones 43, 53, 63 correspond to a third phase of the electrical network, these groups of three cones corresponding respectively to a loss of vacuum in the bottle of the phase, a corona effect and a conductive part at floating potential. In this example, it is preferable to shrink the cones to approximately 30° in width, i.e. to shrink them to +/−15° around the dominant central value, to avoid overlaps and better distinguish the various sectors.

The processing unit may be incorporated in an electronic module which is mounted, for example, on a DIN rail at the front portion of a vacuum circuit breaker and which also incorporates an electrical power supply for the processing unit. The processing unit comprises known means for digitizing, filtering and amplifying the analogue signals originating from the sensors and of course comprises a memory for storing the information received and/or the information calculated. Moreover, the electronic module may also comprise a Human-Machine interface and a wired or wireless network communication interface, so as to be able to report and transmit the events/alarms detected by the monitoring device.

The invention claimed is:

1. A device for monitoring partial discharges in an AC electrical network, the monitoring device being mounted in a switching apparatus provided with a vacuum bottle connected to one phase of the AC network, the monitoring device comprising:
a partial discharge detector positioned facing the vacuum bottle,
wherein the partial discharge detector is a capacitive sensor including a first conductive surface separated by an insulating layer from a second conductive surface connected to earth, the first conductive surface being positioned facing a metal screen of the vacuum bottle, and
an electronic processing unit receiving a first signal representative of current pulses generated by the partial discharges detected by the partial discharge detector, and receiving a second signal representative of a voltage of the AC electrical network,
wherein the electronic processing unit is configured to count during a predetermined duration, the current pulses generated by the partial discharges, calculate a phase angle of the current pulses with respect to the second signal, and determine, according to a value of the phase angle and a number of current pulses counted during the predetermined duration, whether the partial discharges originate from a loss of vacuum in the vacuum bottle.

2. The monitoring device according to claim 1, wherein the electronic processing unit is configured to determine that the partial discharges originate from a loss of vacuum in the vacuum bottle when the phase angle is between −20° and +20°.

3. The monitoring device according to claim 1, wherein the electronic processing unit is configured to determine that the partial discharges originate from a corona effect when the phase angle is between 250° and 290°.

4. The monitoring device according to claim 1, wherein the electronic processing unit is configured to determine that the partial discharges occur between conductive parts at floating potential when the phase angle is between 170° and 210°.

5. The monitoring device according to claim 1, wherein the electronic processing unit is configured to determine that the partial discharges originate from a loss of vacuum in the vacuum bottle when the phase angle is between −30° and +30°.

6. The monitoring device according to claim 1, wherein the electronic processing unit is configured to determine that the partial discharges originate from a loss of vacuum in the vacuum bottle when the number of negative current pulses is greater than the number of positive current pulses generated by the partial discharges on the first signal.

7. A switching apparatus including a vacuum bottle for each phase of a multiphase AC electrical network, wherein the switching device includes for each phase a monitoring device according to claim 1.

8. The monitoring device according to claim 1, wherein the electronic processing unit counts the current pulses generated by the partial discharges for each of plural phase angles during the predetermined duration.

9. The monitoring device according to claim 1, wherein the first conductive surface is positioned facing the metal screen of the vacuum bottle so that a charge is stored between the first conductive surface and the metal screen of the vacuum bottle.

10. A method for monitoring partial discharges in an AC electrical network, the method comprising:
generating a first signal including current pulses generated by partial discharges detected by a partial discharge detector positioned facing a vacuum bottle, wherein the partial discharge detector is a capacitive sensor including a first conductive surface separated by an insulating layer from a second conductive surface connected to earth, the first conductive surface being positioned facing a metal screen of the vacuum bottle,
receiving the first signal representative of the current pulses generated by the partial discharges detected by the partial discharge detector,
receiving a second signal representative of a voltage of the AC electrical network,
counting during a predetermined duration the current pulses generated by the partial discharges,
calculating a phase angle of the current pulses with respect to the second signal, and
determining, according to a value of the phase angle and a number of current pulses counted during the predetermined duration, whether the partial discharges originate from a loss of vacuum in the vacuum bottle.

11. The method for monitoring partial discharges according to claim 10, wherein the monitoring method determines that the partial discharges originate from a loss of vacuum in the vacuum bottle when the phase angle is between −20° and +20°.

12. The method for monitoring partial discharges according to claim 10, wherein the monitoring method determines that the partial discharges originate from a corona effect when the phase angle is between 250° and 290°.

13. The method for monitoring partial discharges according to claim 10, wherein the monitoring method determines that the partial discharges occur between conductive parts at floating potential when the phase angle is between 170° and 210°.

14. The method for monitoring partial discharges according to claim 10, wherein the monitoring method determines that the partial discharges originate from a loss of vacuum in the vacuum bottle when the phase angle is between −30° and +30°.

15. The method for monitoring partial discharges according to claim 10, wherein the monitoring method determines that the partial discharges originate from a loss of vacuum in the vacuum bottle when the number of negative pulses is greater than the number of positive pulses generated by the partial discharges on the first signal.

16. The method for monitoring partial discharges according to claim 10, wherein the first conductive surface is positioned facing the metal screen of the vacuum bottle so that a charge is stored between the first conductive surface and the metal screen of the vacuum bottle.

* * * * *